(12) United States Patent
Altendorf et al.

(10) Patent No.: US 8,596,208 B2
(45) Date of Patent: Dec. 3, 2013

(54) PICK ASSEMBLY FOR AGRICULTURAL SEED PRODUCT AND PICK FOR THE PICK ASSEMBLY

(75) Inventors: Wayde Altendorf, Hickson, ND (US); Michael Nilson, West Fargo, ND (US)

(73) Assignee: Crary Industries, Inc., West Fargo, ND (US)

( * ) Notice: Subject to any disclaimer, the term of this patent is extended or adjusted under 35 U.S.C. 154(b) by 478 days.

(21) Appl. No.: 13/028,373

(22) Filed: Feb. 16, 2011

(65) Prior Publication Data

US 2012/0204774 A1 Aug. 16, 2012

(51) Int. Cl.
*A01C 9/00* (2006.01)

(52) U.S. Cl.
USPC .......................................... 111/177; 221/214

(58) Field of Classification Search
USPC ............ 111/170, 17, 908; 221/213, 214, 215; 43/6
See application file for complete search history.

(56) References Cited

U.S. PATENT DOCUMENTS

| 1,843,229 A | * | 2/1932 | Hist ............................... 221/215 |
| 1,963,036 A | * | 6/1934 | Trolley ...................... 198/550.4 |
| 2,340,240 A | * | 1/1944 | White .............................. 111/91 |
| 2,564,879 A | * | 8/1951 | Cook ............................ 221/215 |
| 4,791,995 A | * | 12/1988 | Hochlan, Jr. ..................... 172/21 |
| 5,152,348 A | * | 10/1992 | Flanagan et al. ................. 172/21 |
| 5,477,791 A | * | 12/1995 | Nakashima et al. ........... 111/105 |
| 6,662,736 B1 | * | 12/2003 | Lowe et al. ..................... 111/96 |
| 6,901,869 B1 | | 6/2005 | Cronin |

OTHER PUBLICATIONS

TerraMarc/Crary, Stainless Steel 416 HT RC 24-27, Drawing No. 46398-00, Jul. 4, 2008.
TerraMarc/Crary, Stainless Steel 416 HT RC 24-27, Drawing No. 46397-00, Jul. 4, 2008.
TerraMarc/Crary, Stainless Steel 416 HT RC 24-27, Drawing No. 0116-0029-00, Aug. 9, 1994.
Agromac International, Inc., Stainless Steel 416 HT RC 28-32, Drawing No. L-00116-00037, Jun. 20, 1997.

* cited by examiner

*Primary Examiner* — Jamie L McGowan
(74) *Attorney, Agent, or Firm* — Wood, Phillips, Katz, Clark & Mortimer

(57) ABSTRACT

A pick assembly for delivering a seed product from a supply thereof to a delivery location and having a pick wheel and at least a first pick arm assembly on the pick wheel with a first cantilever-mounted pick. The pick: a) penetrates a seed product from a supply and releases the seed product to a delivery location as an incident of the pick wheel turning. The first pick has a body with an exposed surface that tapers over at least a portion of the length of the body. At least one discrete raised holding element is on the exposed surface of the body and has an axial width bounded by axially spaced edges. The one holding element at least one of: a) extends through less than fully around a lengthwise axis of the first pick body; and b) has gaps at both axially spaced edges, each extending along the lengthwise axis a distance greater than the axial width.

20 Claims, 7 Drawing Sheets

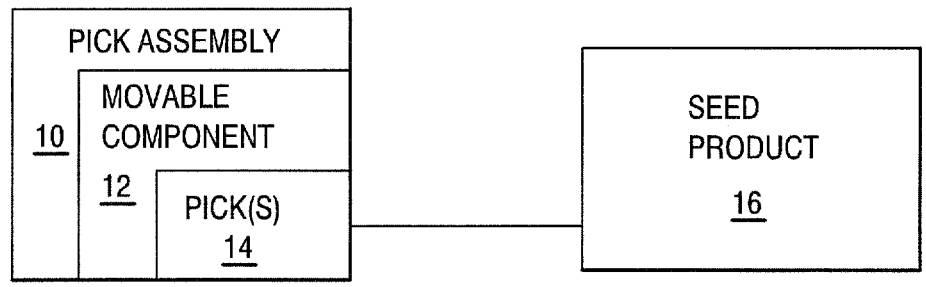
*Fig. 1*
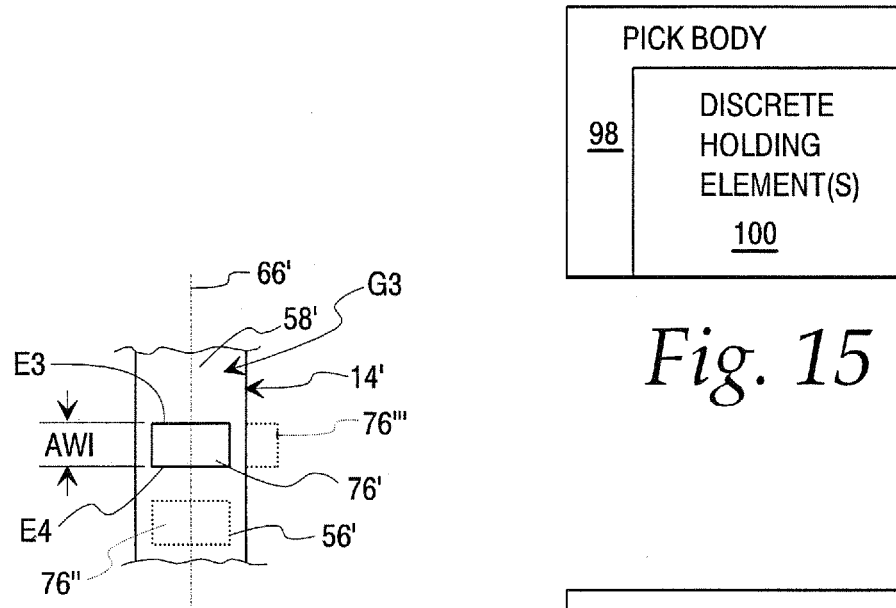
*Fig. 13*
*Fig. 15*
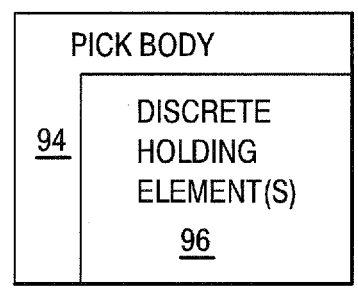
*Fig. 14*

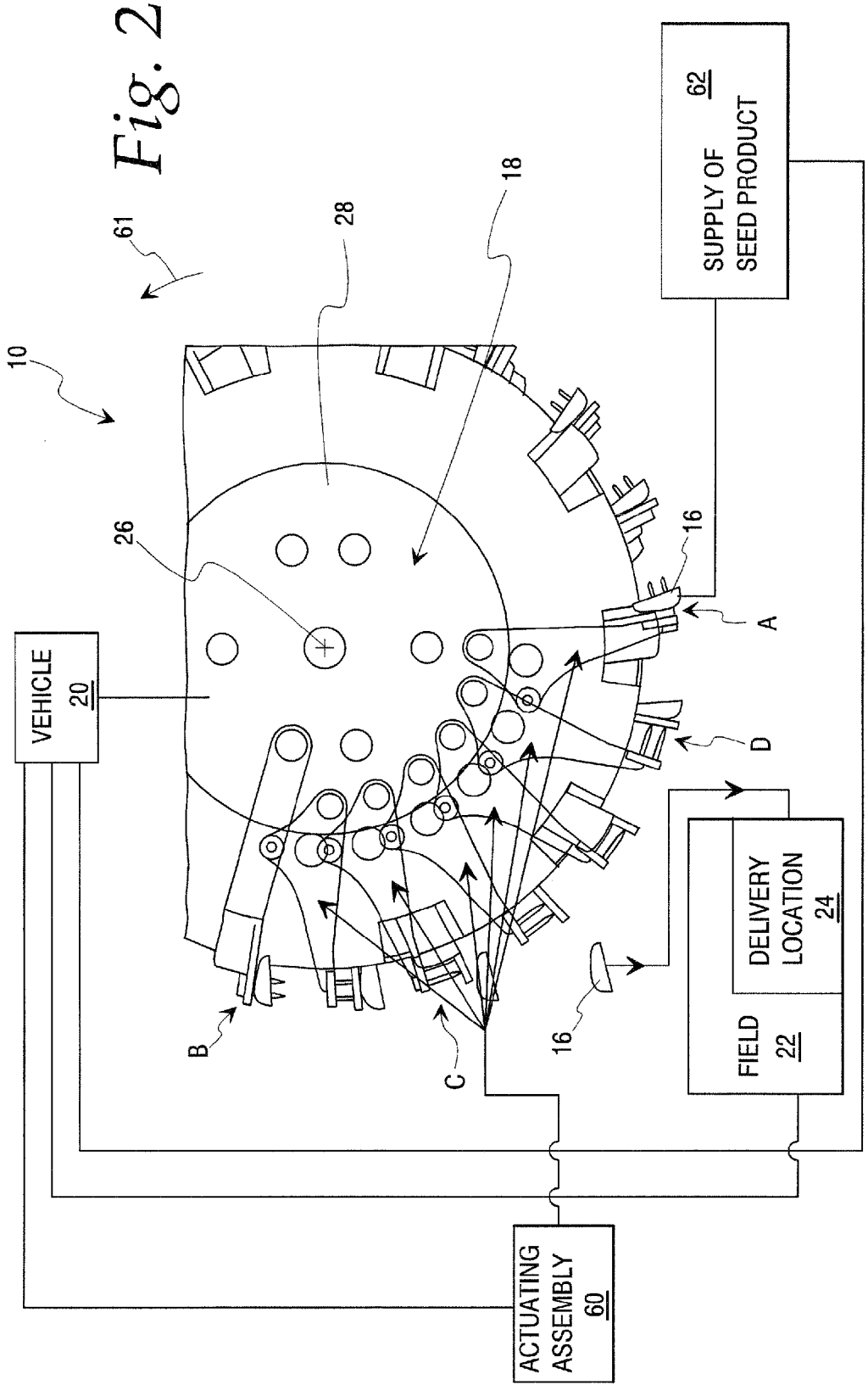

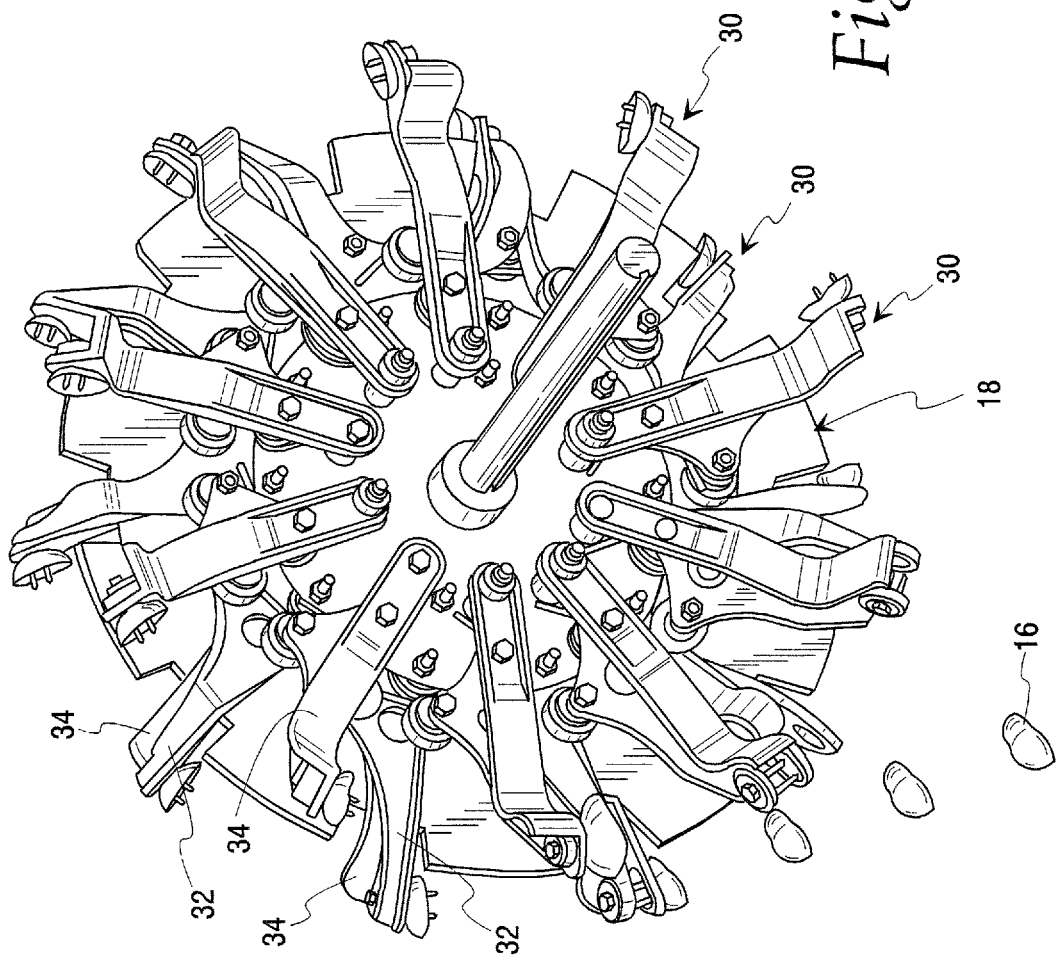

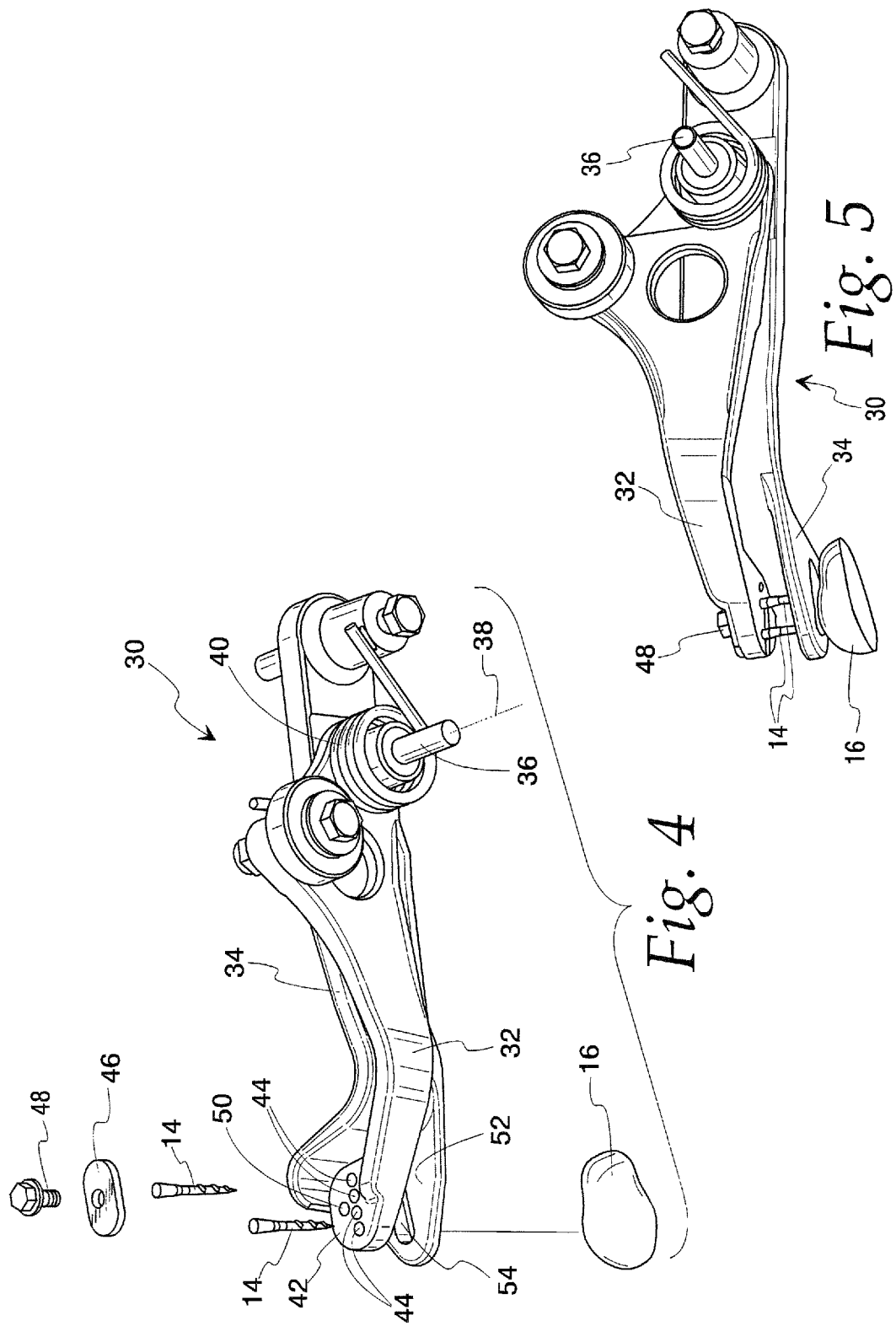

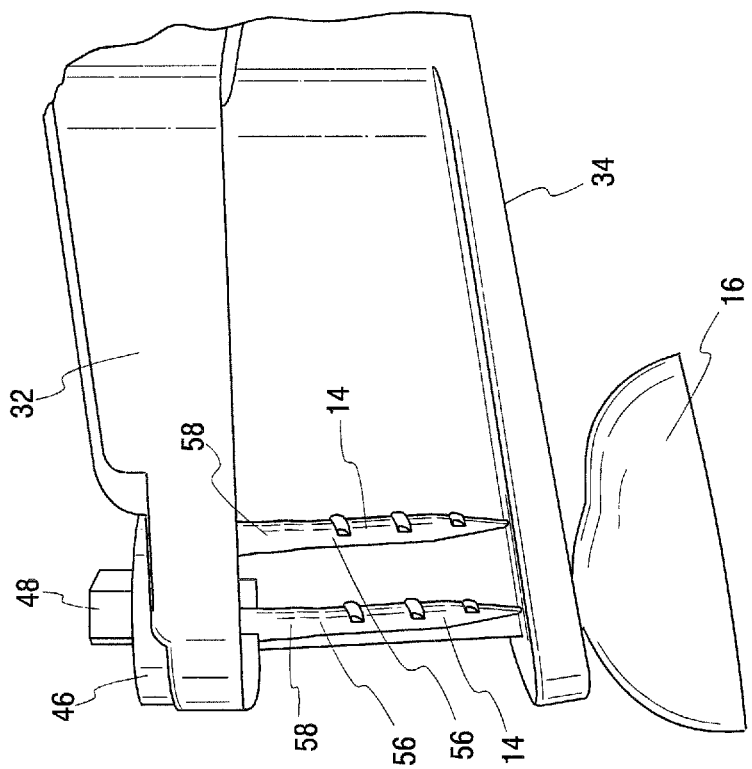
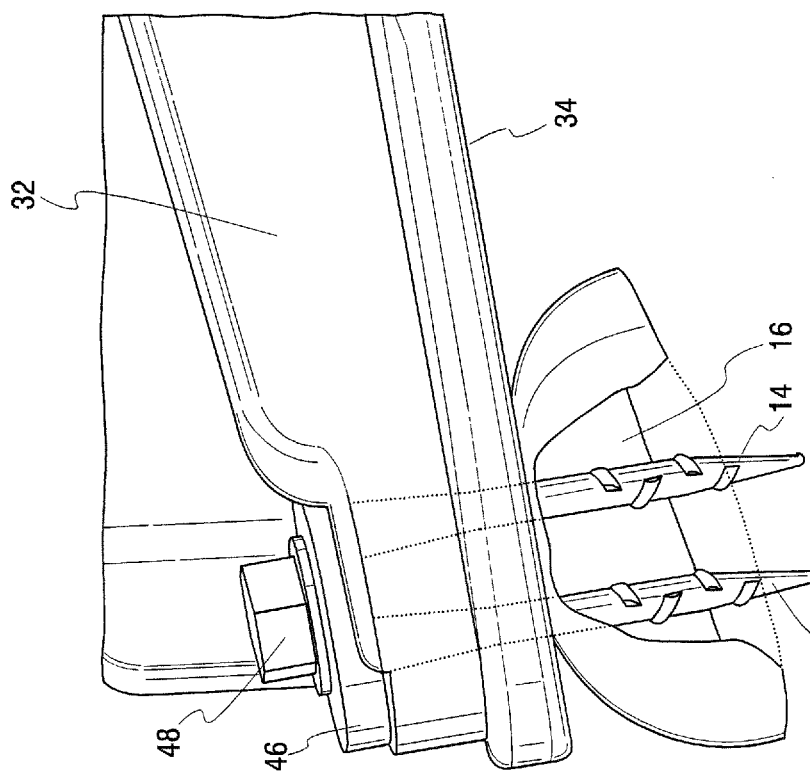

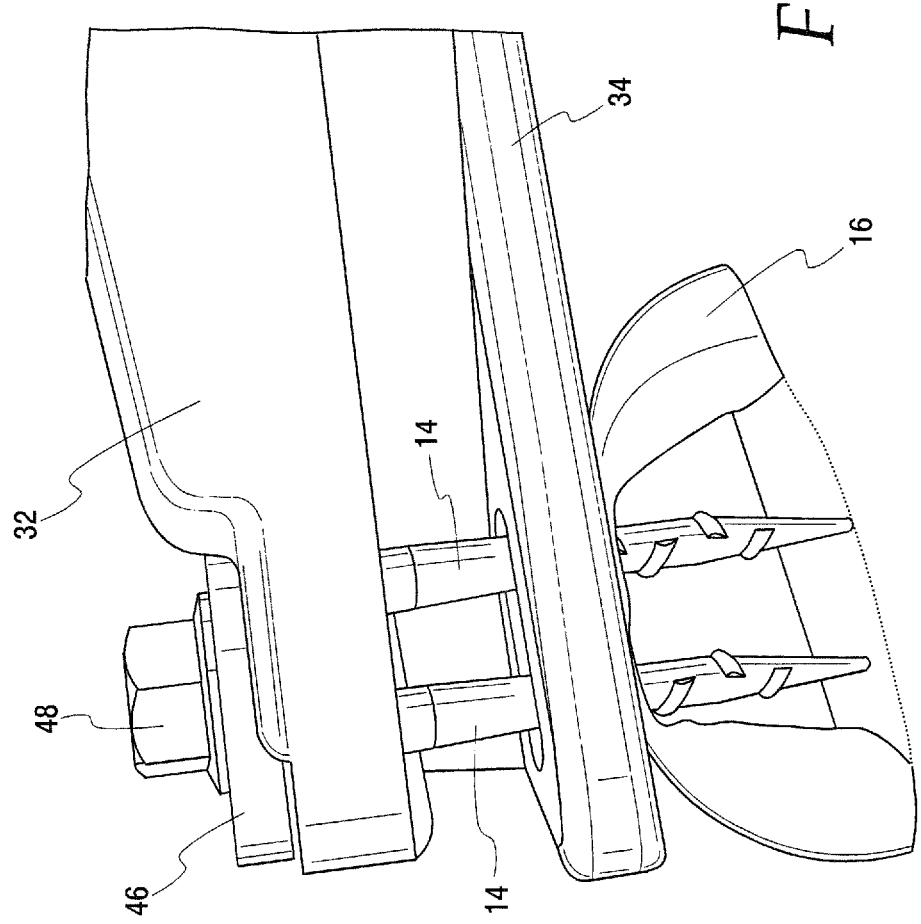

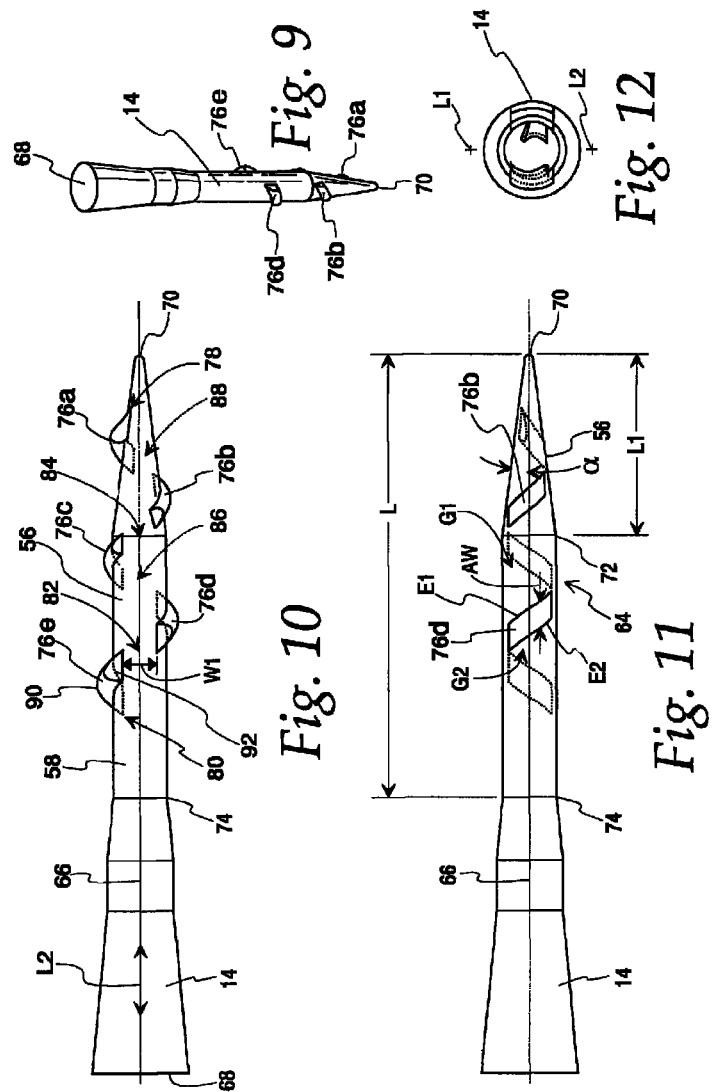

PICK ASSEMBLY FOR AGRICULTURAL SEED PRODUCT AND PICK FOR THE PICK ASSEMBLY

BACKGROUND OF THE INVENTION

1. Field of the Invention

This invention relates to pick assemblies for conveying agricultural seed product from a supply thereof to a delivery location and, more particularly, to a pick assembly using a pick to penetrate and frictionally hold the seed product during conveyance thereof.

2. Background Art

Pick assemblies are used on planters to continuously convey agricultural seed product from a supply thereof to a delivery location, as within a furrow, as a towing vehicle for the planter is advanced over a field. Multiple pick assemblies are incorporated into the planter to allow simultaneous planting in spaced rows. In one exemplary form, each pick assembly has a pick wheel that turns around an axis. A plurality of pick arm assemblies are provided around the circumference of the wheel, with each made up of paired pick and stripper arms. The pick arm has a cantilever-mounted pick that is configured to penetrate seed product within a supply so as to cause the same to be frictionally held with the seed product in a holding position. As the wheel turns through a first angular path portion, the seed product in the holding position is conveyed from the supply towards the delivery location. As the wheel moves in another angular path portion, the pick arm cooperates with an actuating assembly that progressively moves the pick arm relative to the stripper arm, as an incident of which the stripper arm draws the seed product off the pick, whereby the seed product is allowed to move under its own weight to the delivery location.

Each of the picks has a nominally cylindrical shape with a lengthwise axis extending between a mounting end and a free end. The free end has a sharpened point to facilitate its entry into seed product. The body of the pick tapers progressively from the free end over at least a portion of the length of the body so as to produce a wedging action as the pick penetrates a seed product.

To allow the picks to fully penetrate the seed product, the picks have a relatively slender configuration. After extended periods of use, the picks abrade and may become dull, bent, otherwise reconfigured, or broken. Thus, it is anticipated that periodic replacement of the picks will be necessary. When it becomes necessary to replace some or all of the picks, the planting vehicle is in a down state. Accordingly, it is desirable to facilitate mounting and replacement of the picks in a manner whereby this task can be carried out quickly and easily.

Designers of picks are motivated by objectives that often compete with each other. First and foremost, the picks must be effective from an operational standpoint. Second, they must be durable with an adequate life in a relatively harsh environment. Third, they must be relatively inexpensive since it is expected that they will be replaced periodically.

From an operational standpoint, it is critical that the holding characteristics of the picks be such that they can be readily advanced into the seed product and at the same time frictionally held therewithin so that they do not prematurely release the seed product as the pick wheel is advanced. Consistent seed spacing accounts for uniform crop size, which maximizes price that can be demanded for a crop. Skipping of a seed placement and double seed placement impair this uniformity. Thus, the picks must be designed so that each engages and delivers one and only one seed product for each wheel revolution. A seed product that is not appropriately held may release from a pick prematurely, resulting each time in the skipping of a seed placement.

Heretofore, to generate an appropriate holding force between the picks and seed product, aside from producing a tapered construction that produces a wedging action, the exposed surfaces of the picks have been effectively roughened to increase frictional holding forces between the exposed pick surface and the inside of the penetrated seed product. These surfaces have been roughened in the past by forming continuous shallow rings, threads, etc.

Picks have been made from metal in the past. The roughening or texturing of the exposed surfaces thereof may be imparted through a machining operation that is carried out as, or after, the picks are blanked. Metal products, while durable, represent potentially a significant financial investment in terms of the material, the blank formation, and any subsequent processing thereof. The industry has generally been willing to make the additional financial investment in metal picks to reduce the incidence of breakage. Broken picks account for skipped delivery of seed product, which compromises crop yield and quality.

Ideally, the picks are designed so that they are convenient to install and replace with a minimal time investment, effectively hold seed product during operation of the equipment, are durable to have an adequate life, and at the same time are relatively inexpensive so that they can be regularly replaced without a burdensome financial investment. Designers in this industry continue to strive towards a design that meets the above design criteria.

SUMMARY OF THE INVENTION

In one form, the invention is directed to a pick assembly for delivering a seed product from a supply thereof to a delivery location. The pick assembly includes: a pick wheel that is turned around an axis; and at least a first pick arm assembly on the pick wheel having at least a first cantilever-mounted pick that is caused to: a) penetrate a seed product from the supply thereof so that the seed product is in a holding position; b) advance the seed product in the holding position; and c) release the seed product from the holding position for movement of the seed product to a delivery location as an incident of the pick wheel turning around the axis. The first pick has a body with a lengthwise axis extending between spaced mounting and free ends. The body has an exposed surface that tapers over at least a portion of the length of the body to produce a wedging action as the first pick penetrates the seed product to frictionally maintain the penetrated seed product in the holding position. There is at least one discrete raised holding element on the exposed surface of the body that: a) has an axial width bounded by axially spaced edges; b) penetrates the seed product with the seed product in the holding position; and c) at least one of: i) extends through less than fully around the lengthwise axis of the first pick body; and ii) has gaps at both axially spaced edges each extending along the lengthwise axis a distance greater than the axial width.

In one form, the one discrete raised holding element extends through less than 180° around the lengthwise axis of the first pick body.

In one form, the one discrete raised holding element has a spiral shape.

In one form, the at least one discrete raised holding element includes a second discrete raised holding element and the one and second discrete holding elements cooperatively have an interrupted spiral shape.

In one form, the one pick is made from a non-metal material.

In one form, the one pick is made through a molding process.

In one form, the at least one discrete raised holding element includes a plurality of discrete raised holding elements each of which extends through less than 180° around the lengthwise axis of the first pick body and which cooperatively define a plurality of interrupted turns around the lengthwise axis of the first pick body.

In one form, one of the gaps resides between first and second of the interrupted turns.

In one form, there is a plurality of discrete raised holding elements and none of the discrete raised holding elements resides at the surface along separate axial lines at diametrically opposite locations on the exposed body of the first pick.

In one form, there are at least four discrete raised holding elements.

In one form, the exposed surface on the body on the first pick tapers at a first angle relative to the lengthwise axis of the body of the first pick over a first lengthwise distance from the free end to a first axial location that is less than ½ an axial length of the exposed surface and has either: a) a lesser taper; or b) no taper over a second lengthwise distance from the first axial location toward the mounting end of the body of the first pick.

In one form, the one discrete raised holding element is on the exposed surface on the body of the first pick along the first lengthwise distance.

In one form, the at least one discrete raised holding element includes a plurality of discrete raised holding elements that cooperatively have an interrupted spiral shape extending along and axially beyond the first lengthwise distance.

In one form, the at least one discrete raised holding element includes a plurality of discrete raised holding elements including first and second discrete raised holding elements that project radially a different distance from the exposed surface of the body.

In one form, the one discrete raised holding element has a convex outer surface between the axially spaced edges.

In one form, the one discrete raised holding element has circumferentially spaced ends and at least one of the circumferentially spaced ends has a ramped shape.

In one form, the exposed surface on the body of the first pick has an axial length and the at least one discrete raised holding element extends over more than one half the axial length of the exposed surface on the body of the first pick.

In one form, the pick assembly is provided in combination with a supply of seed product that resides in a path of movement of the first pick.

In one form, the pick assembly includes a plurality of pick arm assemblies at circumferentially spaced locations on the pick wheel. Each pick arm assembly has paired pick and stripper arms. Each pick arm has at least a first pick. Each pick arm is movable relative to a paired stripper arm between a carrying position and a release position. The pick assembly further includes an actuating assembly. The actuating assembly cooperates with the pick wheel so that with each revolution of the pick wheel, each pick arm assembly is caused to move: a) through a first angular path portion with the pick arm in a carrying position to cause seed product from the supply and penetrated and frictionally engaged by the pick so as to be in the holding position to be advanced with the pick arm; and b) through a second angular path portion wherein the pick arm assembly cooperates with the actuating assembly to cause the pick arm to move progressively relative to the stripper arm from the carrying position into the release position as an incident of which the stripper arm draws the frictionally held seed product off of the first pick and out of the holding position to be moved to the delivery location.

In one form, the pick assembly is provided in combination with a moving vehicle upon which the pick assembly is operatively mounted and through which the pick assembly can be advanced over and relative to a field into which the seed product is delivered for planting.

BRIEF DESCRIPTION OF THE DRAWINGS

FIG. 1 is a schematic representation of a pick assembly, according to the present invention, and including a movable component with one or more picks thereon to engage a seed product during operation;

FIG. 2 is a partially schematic, fragmentary, side elevation view of one specific form of pick assembly, as shown in FIG. 1, with the movable component in the form of a pick wheel with pick arm assemblies spaced circumferentially therearound;

FIG. 3 is a perspective view of the pick wheel in FIG. 2;

FIG. 4 is an enlarged, partially exploded, perspective view of one of the pick arm assemblies in FIGS. 2 and 3;

FIG. 5 is a view of the pick arm assembly as in FIG. 4 but from a different perspective;

FIG. 6 is an enlarged, fragmentary, perspective view of one of the pick arm assemblies in a carrying state;

FIG. 7 is a view as in FIG. 6 with the pick arm assembly in a released state;

FIG. 8 is a view as in FIGS. 6 and 7 with the pick arm assembly in transition between the carrying and released states of FIGS. 6 and 7;

FIG. 9 is an enlarged, perspective view of one of the picks on the pick arm assemblies in FIGS. 2-8;

FIG. 10 is a further enlarged, elevation view of the pick in FIG. 9;

FIG. 11 is a view as in FIG. 10 with the pick rotated around a lengthwise axis therefor;

FIG. 12 is an enlarged, end elevation view of the pick in FIGS. 9-11;

FIG. 13 is a fragmentary, elevation view of a modified form of pick, according to the present invention;

FIG. 14 is a schematic representation of a further modified form of pick, according to the present invention; and FIG. 15 is a schematic representation of a still further modified form of pick, according to the invention.

DETAILED DESCRIPTION OF THE PREFERRED EMBODIMENT

In FIG. 1, a pick assembly, according to the present invention, is shown in schematic form at 10. The pick assembly 10 has a movable component 12 with at least one pick 14 thereon. As the movable component 12 is repositioned, the pick 14 thereon penetrates a seed product 16 and conveys the seed product 16 from a pickup location to a spaced delivery location. While the pick assembly 10 will be described in one specific form hereinbelow, the schematic showing in FIG. 1 is intended to encompass virtually a limitless number of different designs into which the inventive concepts can be incorporated. The primary focus of the invention herein is on the configuration of the picks 14. The picks 14 are responsible for penetrating the seed product 16 and frictionally holding the penetrated seed product 16 as the movable component 12 advances in a predetermined path. The picks 14 are subsequently stripped of the seed product 16 so that the seed product 16 can be directed to a delivery location.

The invention is not limited to the preferred embodiment as described hereinbelow. Any application wherein a seed product is penetrated and frictionally held to be advanced through a movable component is within the scope of the invention. The schematic showing in FIG. 1 is intended to encompass virtually all such designs.

Referring now to FIGS. 2-12, one specific form of the inventive pick assembly 10, as depicted in FIG. 1, is shown. In this embodiment, the pick assembly 10 has a pick wheel 18 that is part of a planter that is operatively mounted upon, or towed by, a vehicle 20 of conventional construction. The vehicle 20 is advanced relative to an underlying field 22 into which the seed product 16, shown as a potato, is implanted, as in a furrow. This furrow represents the delivery location 24, previously described.

In operation, the pick wheel 18 is turned around an axis 26. The pick wheel 18 has a body 28 upon which at least one pick arm assembly 30, and in this embodiment a plurality of pick arm assemblies 30, is/are mounted in circumferentially spaced relationship. The pick arm assemblies 30 are provided in reversed orientation on opposite sides of the pick wheel 18. Each pick arm assembly 30 consists of a paired pick arm 32 and a stripper arm 34. The pick arm 32 and stripper arm 34 are joined through a post 36 which allows the pick and stripper arms 32, 34 to be guidingly moved relative to each other around an axis 38, defined by the post 36, between a carrying state as shown in FIG. 6, and a release state, shown in FIG. 7. While both arms 32, 34 might be movable, in this embodiment the stripper arms 34 are fixed relative to the wheel body 28, with the pick arms 32 movable relative to the pick arms 32 between carrying and release positions, shown respectively in FIGS. 6 and 7, and corresponding to the aforementioned carrying and release states for the pick arm assembly 30. A torsion spring 40 normally urges the pick arm 32 towards its carrying position.

The pick arm 32 has a flat wall 42 with spaced openings 44 therethrough, each to accept one of the picks 14. As mentioned above, at least one pick 14 is operatively mounted. More preferably, two picks 14 are operatively mounted by directing each of them into a selected one of the openings 44. The four openings 44 allow different placements of the picks 14.

The details of the construction of the picks 14 will be set forth below. The picks 14 are each operatively mounted in their respective opening 44 in the same manner as described for the picks in U.S. Pat. No. 6,901,869, commonly owned herewith. The disclosure in U.S. Pat. No. 6,901,869 is incorporated herein by reference.

Once the picks 14 are directed into the openings 44, a holding plate 46 is installed using a threaded fastener 48 secured within a bore 50 on the wall 42. The plate 46 captively maintains the picks 14 in their operative position and can be removed to facilitate replacement of the picks 14, as needed.

The stripper arm 34 has a flat wall 52 that underlies the wall 42 on the pick arm 32. The wall 52 has an elongate through slot 54 that is large enough to register with all of the openings 44 to allow passage therethrough of the picks 14 in any of the openings 44. With the pick arm assembly 30 in the carrying state of FIG. 6, exposed surfaces 56 on a body 58 of each pick 14 project through the slot 54 adequately to engage and hold one of the seed products 16.

An actuating assembly 60 is provided on the vehicle 20 and cooperates with the pick wheel 18 during each revolution of the pick wheel 18, as described below relative to FIG. 2. At location A in FIG. 2, the picks 14 on each pick arm assembly 30 are shown penetrating a seed product 16 from a supply thereof, as indicated at 62, so that the seed product 16 is in a holding position. The pick arm assembly 30, with the seed product 16 in the holding position at A, moves as the pick wheel 18 rotates around its axis 26 in the direction indicated by the arrow 61, through a first angular path portion to the location at B, whereat the pick arm assembly 30 interacts with the actuating assembly 60. As the wheel continues to advance, the pick arm assembly 30 moves through a second angular path portion from the location at B and cooperates with the actuating assembly 60 in a manner so as to cause the pick arm 32 to move progressively relative to the stripper arm 34 from the carrying position into the release position at the C location, as an incident of which the stripper arm 34 draws the frictionally held seed product 16 off of the picks 14 to be released under their own weight for direction to the delivery location 24.

The advancing pick arm assembly 30 continues to cooperate with the actuating assembly 60 up to the D location. Between the D and A locations, the actuating assembly 60 disengages from the pick arm assembly 30, whereupon the torsion spring 40 drives the pick arm 32 so that it snaps back into its carrying position. As this occurs, the picks 14 are driven through the slot 54 and into a seed product 16 in the supply 62 to place the seed product 16 in the holding position. This cycle repeats as the pick wheel 18 continues to turn on the advancing vehicle 20.

As noted above, the details of operation of the pick wheel 18 are not critical to the present invention and described more fully in U.S. Pat. No. 6,901,869.

The present invention is concerned primarily with the configuration of the picks 14 and, more particularly, to the configuration of an exposed portion 64 thereon that actually penetrates and frictionally holds the seed product 16 in operation.

As seen particularly in FIGS. 9-12, each pick 14 has a nominally cylindrical body 58 with a central axis 66 extending between a mounting end 68 and a free end 70. The mounting end 68 is secured to the wall 42 on the pick arm 32, as described above and in greater detail in U.S. Pat. No. 6,901,869. With this arrangement, the length L of the body 58 remains exposed through the wall 52 on the stripper arm 34 to penetrate the seed product 16. The length L may be on the order of one inch; however, this is not critical to the invention.

The exposed surface 56 of the body 58 of the pick 14 is generally symmetrical about the central axis 66 and tapered from the free end 70 over at least a portion of the length of the body 58 to produce a wedging action as the pick 14 penetrates the seed product 16 to frictionally maintain the penetrated seed product in the holding position therefor.

The surface 56 tapers at a first angle α relative to the axis 66 over a first lengthwise distance L1 to a first axial location 72 that is less than one-half the axial length L. Between the first axial location 72 and a second axial location 74 at the end of the length L, the exposed surface 56 has a lesser taper than over the axial length L1. That is, the angle corresponding to the angle α may be less than α or, alternatively, there may be no taper over the lengthwise extent of the outer surface between the locations 72, 74.

The invention contemplates that there be at least one discrete raised holding element on the exposed surface 56 of the body 58 that penetrates the seed product 16 with the seed product 16 in the holding position. In this embodiment, there are five discrete, raised, holding elements 76a, 76b, 76c, 76d, 76e on the exposed surface 56.

The discrete holding elements 76a-76e each has a spiral shape. Collectively, the discrete holding elements 76a-76e define an interrupted spiral shape that extends from the axial location at 78 to the axial location at 80. The axial location at 78 is spaced slightly from the free end 70, with the axial location 80 being at, or spaced slightly from, the axial location 74 representing the lengthwise end of the exposed surface 56.

At least one, and preferably all, of the discrete holding elements 76a-76e extends through less than fully around the lengthwise axis 66 of the body 58. More preferably, at least one of the discrete holding elements 76a-76e, and more preferably all of the discrete holding elements 76a-76e, extends through less than 180° around the lengthwise axis 66 of the body 58.

In the depicted embodiment, the discrete holding elements 76a-76e collectively extend in an interrupted spiral path to define approximately two full turns around the axis 66. The turns are spaced the same distance from each other over a substantial axial distance, and preferably over their entire axial extent.

In this embodiment, the discrete holding elements 76a-76e are generally the same in construction with the exemplary holding element 76d having a constant axial width AW bounded by axially spaced edges E1, E2. Gaps G1, G2 are provided at both axially spaced edges E1, E2 that extend along the lengthwise axis 66 a distance greater than the axial width AW. In this embodiment, the gap G1 between turns and the discrete holding elements 76b, 76d has an axial extent that is 3-4 times the axial width AW of the holding element 76d.

The interruptions of the spirals produce circumferential gaps 82, 84 between the exemplary discrete holding elements 76d, 763, and 76b, 76c, respectively. Corresponding gaps 86, 88 are formed at a diametrically opposite location between the discrete holding elements 76c, 76d and 76a, 76b.

As a result, none of the discrete holding elements 76a-76e resides at the exposed surface 56 along the axial line L2 or a corresponding, parallel line L2 at a diametrically opposite location over a width W1 between adjacent holding elements 76a-76e. This construction facilitates molding of the picks 14 without requiring a complex mold configuration as would otherwise be required with a continuous spiral.

In one form, the picks 14 are made from a non-metal material utilizing a molding process. The non-metal material may be a composite, or another type of material that can be mold formed. Of course, the picks 14 might be made from metal.

In the depicted embodiment, the discrete holding elements 76a-76e have convex outer surfaces as indicated at 90, for the representative discrete holding element 76e in FIG. 10, between axially spaced edges thereon corresponding to the edges E1, E2 for the holding element 76d.

The discrete holding elements 76a-76e may have the same axial width or a different width. The discrete holding elements 76a-76e may project radially the same or different distances from the exposed surface 56. The discrete holding elements 76a-76e project radially from the exposed body surface 56 a distance generally equal to their axial width, shown at AW for the holding element 76d. Their radial extent may be on the order of ⅟32 inch or larger and is selected to generate the optimal frictional holding force. It is preferred that the holding elements 76a-76e project adequately to each separately dig its own path in the seed product to generate a localized holding force.

In this embodiment, the discrete holding elements 76a-76e have circumferentially spaced ends at the gaps where the discrete holding elements 76a-76e are interrupted. As seen for exemplary discrete holding element 76e in FIG. 10, the circumferentially spaced end 92 thereon is shown with a ramped shape. This may be the same for all of the corresponding circumferentially spaced ends of the other discrete holding elements 76a-76d.

As an alternative to forming the discrete holding elements so that they cooperatively define an interrupted spiral shape, the shape of some or all of the elements may deviate from the spiral. That is, each of the discrete holding elements might have a spiral shape, which does not align with the spiral shape of other of the discrete holding elements.

Further, as an alternative to a spiral shape, and as shown in FIG. 13, a discrete holding element 76' may project from the surface 56' of a body 58' on a pick 14' with a circumferential shape that is not a spiral. In this embodiment, the discrete holding element 76' shown as a partial ring around the axis 66'. Virtually an unlimited number of other shapes is contemplated, such as a triangle, circle, etc. It is preferred, but not required, that the discrete holding elements do not extend more than 180° around the axis of the pick body. It is also preferred that with this configuration there be gaps G3, G4 at both axially spaced edges E3, E4 that extend along the axis 66' a distance greater than the axial width AW1 between the edges E3, E4. Additional holding elements 76'', 76''' might be provided with the same or a similar shape.

In FIG. 14, a generic form of pick body is shown at 94, according to the invention, with the discrete holding element shown at 96. This schematic showing is intended to generically encompass variations from the preferred forms of the picks described above. FIG. 14 is intended to encompass any pick construction wherein one or more discrete holding elements 96 project outwardly from an exposed surface on the pick body 94 and extend through less than 180° around the pick axis.

In a further variation, a pick body is shown in FIG. 15 at 98, according to the present invention, with at least one discrete holding element 100 that may be in a continuous spiral shape extending through greater than 180° around the pick axis. This construction is differentiated from the prior art by reason of having a substantial gap between turns of the spiral, as seen, for example, in FIG. 10, corresponding to the gaps G1-G4. This design is differentiated by having a greater radial projection of the holding elements 100, which may be on the order of ⅟32 inch or greater to generate a localized holding force within the seed product 16.

The foregoing disclosure of specific embodiments is intended to be illustrative of the broad concepts comprehended by the invention.

The invention claimed is:

1. A pick assembly for delivering a seed product from a supply thereof to a delivery location, the pick assembly comprising:
   a pick wheel that is turned around an axis; and
   at least a first pick arm assembly on the pick wheel and having at least a first cantilever-mounted pick that is caused to: a) penetrate a seed product from the supply thereof so that the seed product is in a holding position; b) advance the seed product in the holding position; and c) release the seed product from the holding position for movement of the seed product to a delivery location as an incident of the pick wheel turning around the axis,
   wherein the first pick has a body with a length and lengthwise axis extending between spaced mounting and free ends,
   the body having an exposed surface that tapers over at least a portion of the length of the body to produce a wedging action as the first pick penetrates the seed product to frictionally maintain the penetrated seed product in the holding position, wherein there is at least one discrete raised holding element on the exposed surface of the body that: a) has an axial width bounded by axially spaced edges; b) penetrates the seed product with the seed product in the holding position; and c) at least one of: i) extends through less than fully around the lengthwise axis of the first pick body; and ii) has gaps at both axially spaced edges each extending along the lengthwise axis a distance greater than the axial width.

2. The pick assembly according to claim 1 wherein the one discrete raised holding element extends through less than 180° around the lengthwise axis of the first pick body.

3. The pick assembly according to claim 1 wherein the one discrete raised holding element has a spiral shape.

4. The pick assembly according to claim 3 wherein the at least one discrete raised holding element comprises a second discrete raised holding element and the one and second discrete holding elements cooperatively have an interrupted spiral shape.

5. The pick assembly according to claim 1 wherein the one pick is made from a non-metal material.

6. The pick assembly according to claim 5 wherein the one pick is made through a molding process.

7. The pick assembly according to claim 3 wherein the at least one discrete raised holding element comprises a plurality of discrete raised holding elements each of which extends through less than 180° around the lengthwise axis of the first pick body and which cooperatively define a plurality of interrupted turns around the lengthwise axis of the first pick body.

8. The pick assembly according to claim 7 wherein one of the gaps resides between first and second of the interrupted turns.

9. The pick assembly according to claim 1 wherein there is a plurality of discrete raised holding elements and none of the discrete raised holding elements resides at the exposed surface along separate axial lines at diametrically opposite locations on the body of the first pick.

10. The pick assembly according to claim 1 wherein there are at least four discrete raised holding elements.

11. The pick assembly according to claim 1 wherein the exposed surface on the body on the first pick tapers at a first angle relative to the lengthwise axis of the body of the first pick over a first lengthwise distance from the free end to a first axial location that is less than ½ an axial length of the exposed surface and has either: a) a lesser taper; or b) no taper over a second lengthwise distance from the first axial location toward the mounting end of the body of the first pick.

12. The pick assembly according to claim 11 wherein the one discrete raised holding element is on the exposed surface on the body of the first pick along the first lengthwise distance.

13. The pick assembly according to claim 12 wherein the at least one discrete raised holding element comprises a plurality of discrete raised holding elements that cooperatively have an interrupted spiral shape extending along and axially beyond the first lengthwise distance.

14. The pick assembly according to claim 1 wherein the at least one discrete raised holding element comprises a plurality of discrete raised holding elements including first and second discrete raised holding elements that project radially a different distance from the exposed surface of the body.

15. The pick assembly according to claim 1 wherein the one discrete raised holding element has a convex outer surface between the axially spaced edges.

16. The pick assembly according to claim 1 wherein the one discrete raised holding element has circumferentially spaced ends and at least one of the circumferentially spaced ends has a ramped shape.

17. The pick assembly according to claim 1 wherein the exposed surface on the body of the first pick has an axial length and the at least one discrete raised holding element extends over more than one half the axial length of the exposed surface on the body of the first pick.

18. The pick assembly according to claim 1 in combination with a supply of seed product that reside in a path of movement of the first pick.

19. The pick assembly according to claim 1 wherein the pick assembly comprises a plurality of pick arm assemblies at circumferentially spaced locations on the pick wheel, each pick arm assembly comprising paired pick and stripper arms, each pick arm having at least a first pick, each pick arm movable relative to a paired stripper arm between a carrying position and a release position, the pick assembly further comprising an actuating assembly, the actuating assembly cooperating with the pick wheel so that with each revolution of the pick wheel each pick arm assembly is caused to move: a) through a first angular path portion with the pick arm in a carrying position to cause seed product from the supply and penetrated and frictionally engaged by the pick so as to be in the holding position to be advanced with the pick arm; and b) through a second angular path portion wherein the pick arm assembly cooperates with the actuating assembly to cause the pick arm to move progressively relative to the stripper arm from the carrying position into the release position as an incident of which the stripper arm draws the frictionally held seed product off of the first pick and out of the holding position to be moved to the delivery location.

20. The pick assembly according to claim 1 in combination with a moving vehicle upon which the pick assembly is operatively mounted and through which the pick assembly can be advanced over and relative to a field into which the seed product is delivered for planting.

* * * * *